(12) United States Patent
Obara et al.

(10) Patent No.: US 7,105,815 B2
(45) Date of Patent: Sep. 12, 2006

(54) METHOD AND APPARATUS FOR COLLECTING DEFECT IMAGES

(75) Inventors: Kenji Obara, Mito (JP); Toshifumi Honda, Yokohama (JP); Toshiro Kubo, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 11/020,255

(22) Filed: Dec. 27, 2004

(65) Prior Publication Data

US 2005/0199808 A1    Sep. 15, 2005

(30) Foreign Application Priority Data

Mar. 10, 2004    (JP) ............................. 2004-066546

(51) Int. Cl.
*G01N 23/00* (2006.01)
*G21K 7/00* (2006.01)
(52) U.S. Cl. ...................................... 250/310; 250/307
(58) Field of Classification Search ................ 250/307, 250/310
See application file for complete search history.

(56) References Cited

U.S. PATENT DOCUMENTS 6,635,873 B1 * 10/2003 Todokoro et al. ........... 250/310
6,791,095 B1 * 9/2004 Pan et al. ............... 250/442.11

FOREIGN PATENT DOCUMENTS

| JP | 05-290786 | 11/1993 |
| JP | 07-201946 | 8/1995 |
| JP | 2000-030652 | 1/2000 |
| JP | 2001-093950 | 4/2001 |

* cited by examiner

*Primary Examiner*—John R. Lee
*Assistant Examiner*—Jennifer Yantorno
(74) *Attorney, Agent, or Firm*—Antonelli, Terry, Stout and Kraus, LLP.

(57) ABSTRACT

To acquire defect images even when a defect exists below an optically transparent film, an electron optical system of an electron microscope is set to a first imaging condition. A defect position of a specimen is set so as to fall within the visual field of the electron microscope, using position data of a defect of the specimen. The position of the defect is imaged by the electron microscope set to the first imaging condition to obtain a first image corresponding to the defect position. The first image is processed to determine whether a defect exists. The electron optical system is then set to a second imaging condition on the basis of the result of determination. A point imaged under the first imaging condition is imaged by the electron microscope set to the second imaging condition to acquire a second image corresponding to a defect position.

9 Claims, 10 Drawing Sheets

IMAGE DETECTED BY OPTICAL INSPECTING DEVICE

SECTION TAKEN ALONG A-A

SEM IMAGE UNDER NORMAL CONDITION

SEM IMAGE UNDER HIGH-ACCELERATION CONDITION (a) ACCELERATING VOLTAGE AND VISUALIZABLE DEPTH (b) IMAGE ACQUIRED BY ACCELRATING VOLTAGE V1

(c) IMAGE ACQUIRED BY ACCELRATING VOLTAGE V2

(d) IMAGE ACQUIRED BY ACCELRATING VOLTAGE V3

FIG.8(a)
CROSS-SECTIONAL VIEW
OXIDE FILM
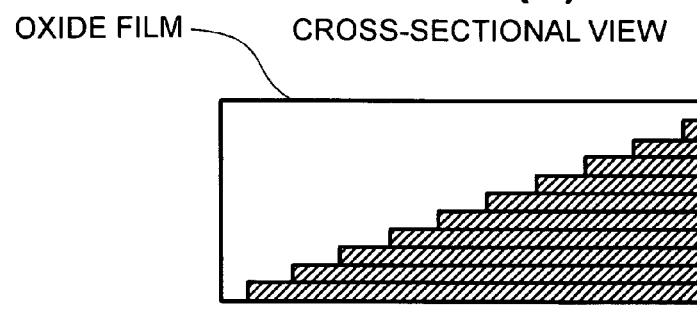
FIG.8(b)
FRONT VIEW
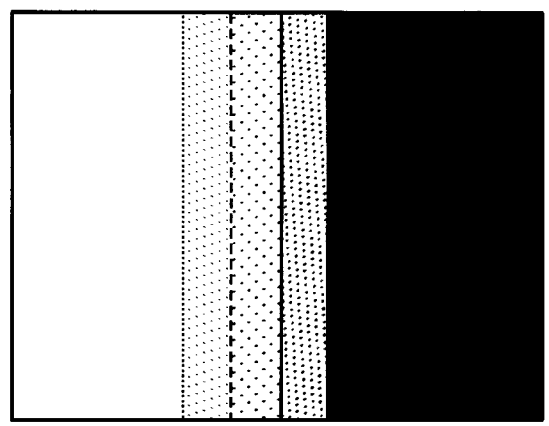
FIG.9(a)
IMAGE 1
FIG.9(b)
IMAGE 2
FIG.9(c)
THREE-DIMENSIONAL COMPOSITE BIRD'S-EYE VIEW
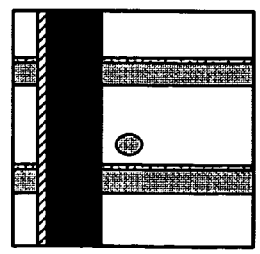
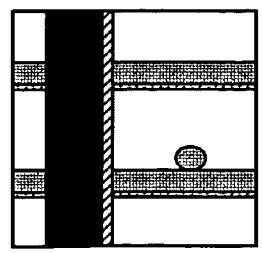
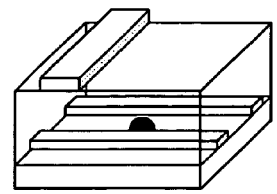

| LOT | AW1125 | WAFER | 3 |
| PROCESS | WIRING 3 | | |
| DEFECT ID | 53 | | |

| FOV | ○○μm | FOV | ○○μm |
| ACCELERATING VOLTAGE | ○○V | ACCELERATING VOLTAGE | ○○V |
| PROBE CURRENT | ○○pA | PROBE CURRENT | ○○pA |
| | | CATEGORY | BELOW-FILM FOREIGN SUBSTANCE 1 |

FIG.16

| IMAGING CONDITION | | |
|---|---|---|
| CONDITION No. | ☐ | |
| ACCELERATING VOLTAGE | ☐ | V |
| PROBE CURRENT | ☐ | pA |
| VISUAL FIELD SIZE | ☐ | μm |
| NUMBER OF ADDITIONS | ☐ | TIMES |

FIG.17

| IMAGING CONDITION | | |
|---|---|---|
| INITIAL VALUE OF ACCELERATING VOLTAGE | ☐ | V |
| INCREASED WIDTH OF ACCELERATING VOLTAGE | ☐ | V |
| MAXIMUM VALUE OF ACCELERATING VOLTAGE | ☐ | V |
| PROBE CURRENT | ☐ | pA |
| VISUAL FIELD SIZE | ☐ | μm |
| NUMBER OF ADDITIONS | ☐ | TIMES |

METHOD AND APPARATUS FOR COLLECTING DEFECT IMAGES

BACKGROUND OF THE INVENTION

The present invention relates in general to a method to be used for collecting defect images of a foreign substance and a defect generated in a thin film device manufacturing process on the basis of inspection information, and an apparatus for use in carrying out the method.

The production of thin-film devices, such as a semiconductor, a liquid crystal display device, a hard disk magnetic head, etc., involves a large number of processes. The number of process steps for performing such work reaches several hundreds of process steps on occasion.

When a foreign substance and anomalies in appearance, such as a break in wiring, etc., occur on a thin-film device due to imperfections and problems involving the manufacturing conditions of the processing equipment, the probability that a failure will occur in such a product becomes high, thus causing a degradation of the yield. Thus, in order to maintain a desired yield and to provide improvements in the manufacture, it is important to specify a defect in a produced device and take measures in connection therewith. Therefore, inspections, such as a foreign substance inspection, a visual inspection, etc., are executed for all main processes, and whether the processing or work is being done properly is monitored. Since the execution of all inspections effected on a substrate to be processed for all working processes is impossible from time and labor restrictions, inspections are normally conducted for substrates to be processed on a basis in lot units or processed substrate units, or in a combination thereof for every several series of process steps. Here, the substrate to be processed is a minimum unit in which product processing is carried out. It indicates one wafer, if a semiconductor is taken as an example.

When a wafer is examined for foreign substances by an inspecting device, for example, the surface of the wafer is scanned with a laser beam to detect the presence or absence of scattered light, so that information concerning the positions and the number of foreign substances which may be present n the wafer can be obtained. When a defect inspection is carried out that involves examination of a wafer for foreign substances and for a possible abnormality of each pattern together, information about the positions and number of significant points or the like can be obtained by, for example, capturing images of the wafer's circuit patterns by means of an optical magnifying imaging device and by making comparisons between the images and images obtained in other similar pattern regions adjacent thereto.

Here, the term "significant points" indicates points outputted as locations where abnormalities are found by the inspection performed by the inspecting device. The foreign substance and the anomalies that appear are subsequently represented as "defects".

A decision as to the presence of an anomaly in a device is often made with a number of defects detected by the inspecting device as a density management index. When the number of defects exceeds a preset reference value, it is judged that a defect is present in the device. Then, each of the defects is imaged in an enlarged form by a reviewer, such as an optical microscope or a scanning electron microscope (hereinafter called "SEM") or the like, on the basis of defect coordinate information detected by the inspecting device to obtain detailed information concerning the defect, such as the size, shape and texture thereof or the like. Detailed inspections, such as an elemental analysis, section observation, etc., are performed to specify a defective device and determine the content of it's the defective condition. Based on the result of this analysis thereof, countermeasures are taken for the device and the process is controlled to prevent degradation of the yield.

In order to bring such review work into a state of automation and high efficiency, a method for automatically acquiring enlarged images of a foreign substance and a defect in an efficient manner on the basis of inspection data outputted from a foreign substance inspecting device or a visual inspecting device has been described in Japanese Patent Laid-Open No. 2000-30652. Estimating the cause of the defects a from defect's visual information depends on high-level judgment of an analyzer, and differences among individuals and the time necessary for such a judgment present problems. Therefore, a method for automatically classifying defects in accordance with a specific rule has been described in Japanese Patent Laid-Open No. Hei 7(1995)-201946.

The significant points detected by the inspecting device are not necessarily limited to defects. There may be cases in which, for example, depressions and projections developed on a pattern, of such an extent that they cannot be recognized as defects, will be detected; components diffusely reflected from the edge portion of the pattern will be detected, a small variation in pattern shape, of such an extent that it cannot be judged as a defect, may be detected; or irregularities in luminance or color due to a small variation in the thickness, of such an extent that it cannot be judged as a defect, may be detected. Thus, when no defects are found in the significant points reviewed in detail, the circumstances may be interpreted to indicate that the device is free of defects, which serves as "disinformation" corresponding to a misdetection of the inspecting device. However, there may be a case in which a misdetection does not lead to such disinformation.

In the case of a defect inspecting device, for example, a circuit pattern is normally imaged using light having a wavelength in the range of ultraviolet light to visible light. Each of the areas for the same patterns located adjacent to each other and the shape of the circuit pattern are compared, and a section in which a difference results therebetween is detected as a defect. The image observed at the time of inspection is not limited to an image of the top surface of a device. When the surface of a substance is covered with a silicon oxide film, for example, the substance is optically transparent, and, hence, a foreign substance and a pattern that exist below the film are also imaged. Therefore, a defect that exists below the film is also detected. On the other hand, when the detailed reviewer consists of a SEM, an electron beam is applied onto a target, and secondary electrons and reflected electrons generated therefrom are brought into form of an image. In this case, the silicon oxide film remains nontransparent. Therefore, when no defect is observed during a detailed review using a SEM adapting to the defect detected by the defect inspecting device, a decision can not be made as to whether the results indicate disinformation or a below-film defect.

The concept of observing the structure of the inside of a specimen, a defect, a foreign substance, etc. through use of an electron beam having high energy has been described in Japanese Patent Laid-Open No. Hei 5(1993)-290786. However, a technique that makes it possible to obtain suitable observations that are compatible between a defect observation of the top surface and an internal observation has not yet been disclosed. Further, the concept of acquiring images under a plurality of observation conditions by use of an electron microscope and classifying defects according to the difference in visibility has been described in Japanese Patent Laid-Open No. 2001-93950. However, a method of bringing a review work operation into high efficiency according to the circumstances of a target defect has not been disclosed therein.

SUMMARY OF THE INVENTION

The present invention provides a means capable of efficiently effecting suitable observations even on a defect on the top surface and a defect below a film of an object being inspected.

The present invention includes a step of acquiring data about a defect position by use of an inspecting device, a step of acquiring an image corresponding to the defect position on a given imaging condition, a step of determining whether a defect exists in the image, and a step of changing the imaging condition on the basis of its determination. The image corresponding to the defect position is obtained under a changed imaging condition. The change in imaging condition includes a change in accelerating voltage. Further, the present invention includes a step of acquiring images from plural directions on the changed imaging condition. A three-dimensional structure is represented in combined form from the plural images.

The present invention includes a plurality of objective lenses and the lenses are each used, depending on an accelerating voltage at the time of observation, by switching between lenses. The present invention has an XYZ stage on which a measured object is mounted, and the working distance is changed depending on the accelerating voltage at the time of observation. The present invention includes a plurality of high-voltage stabilized power supplies, and the high-voltage stabilized power supplies are each used, according to the accelerating voltage at the time of observation, by switching between power supplies.

According to the present invention, when a defect is observed using a SEM on the basis of data concerning the position of a defect, which is outputted from a defect inspecting device by an optical means, the defect can be observed efficiently even when the defect exists below an optically transparent film.

These and other objects, features and advantages of the invention will be apparent from the following more particular description of preferred embodiments of the invention, as illustrated in the accompanying drawings.

BRIEF DESCRIPTION OF THE DRAWINGS

FIG. 8(a) is a diagram showing a section of a sample, and FIG. 8(b) is a diagram of a SEM image obtained by imaging the sample shown in FIG. 8(a) at a given accelerating voltage;

FIG. 9(a) is a diagram of a tilt image 1, FIG. 9(b) is a diagram of a tilt image 2 and FIG. 9(c) is a perspective view of a sample;

FIG. 16 is a diagram depicting one example of an imaging condition input screen according to the present invention; and FIG. 17 is a diagram showing one example of an imaging condition input screen according to the present invention.

DESCRIPTION OF THE PREFERRED EMBODIMENTS

Although embodiments of the present invention to be described hereinafter concern devices that observe defects and analyze elements, such as semiconductor wafers, the present invention is not limited to such devices, but may consist of other types of devices.

Preferred embodiments of the present invention will be described hereinafter with reference to the accompanying drawings.

Figure 1:
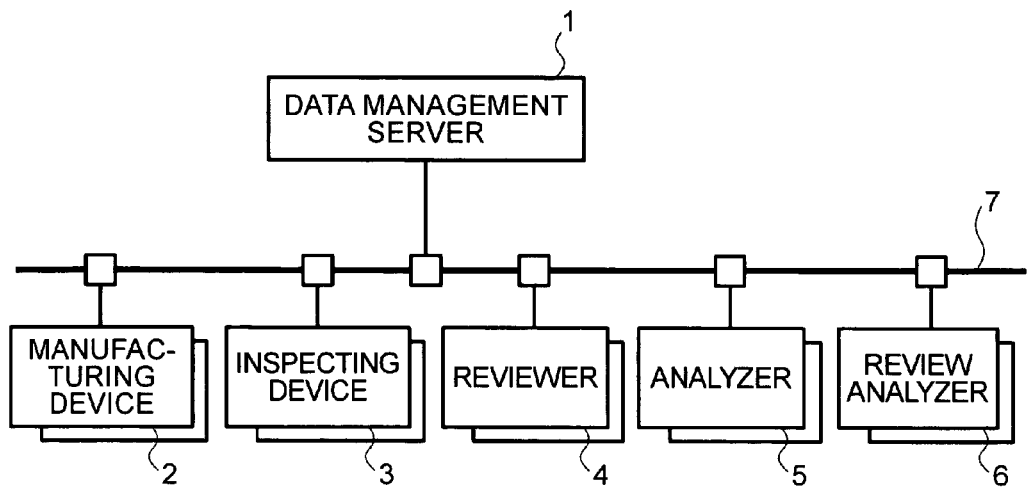
FIG. 1 is a block diagram showing one example of combinations of devices in a production line.

One specific example illustrative of the respective devices used in a wafer production line and their connecting configuration will first be described with reference to FIG. 1. In FIG. 1, the production line has a data management server 1, a semiconductor wafer manufacturing device 2, an inspecting device 3, a reviewer 4, an analyzer 5, a review analyzer 6, and a network 7.

In the production line, the semiconductor wafer manufacturing device 2, the inspecting device 3, the reviewer 4, the analyzer 5 and the review analyzer 6 are connected to one another by the data management server 1 and the network 7.

The manufacturing device 2 is used to manufacture a semiconductor wafer through use of an exposure device, an etching device, etc. The inspecting device 3 operates to detect a defect position on the semiconductor wafer. For example, the inspecting device 3 causes a beam spot of light to scan over the semiconductor wafer through the use of a dark field optical system to specify a defect position depending on the degree of diffused reflection, acquires images for patterns formed in two chips from the two chips through the use of a bright field optical system, and compares these images, to thereby judge a portion at which a difference exists between these images as a defect, thereby detecting it's a defect position. The reviewer 4 observes a defect on the basis of inspection information obtained by the inspecting device 3. The reviewer 4 moves a stage having the semiconductor wafer mounted thereon, positions a target defect on the semiconductor wafer on the basis of defect position information outputted from the inspecting device 3 and observes the defect. As an observing method, a SEM is used, for example. The analyzer 5 analyzes the elements using, for example, an EDX or an Auger electron spectroscopic method. The Auger electron spectroscopic method is a method used for detecting and analyzing Auger electrons emitted from a target when an electron beam is applied to the target. This is a generally well-known method. The review analyzer 6 is a device that is capable of observing a defect and analyzing the elements.

Incidentally, the respective devices for the inspection, observation and analysis need not necessarily be separated from one another. The inspection and review may be performed in combination, as in the case where they are performed within the same device, for example.

The data management server 1 manages data acquired from the inspecting device 3, reviewer 4, analyzer 5 and review analyzer 6. The reviewer 4 and the analyzer 5 are capable of acquiring information, such as defect position coordinates, that is outputted from the inspecting device 3 through the data management server 1.

If data is interavailable between the devices, although one example of the connection has been shown herein, then such a connection configuration may be adopted.

Figure 2A:
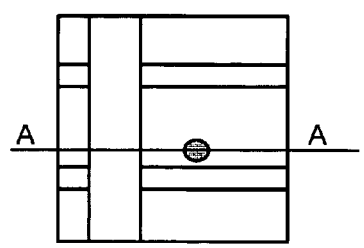
FIG. 2(a) is a diagram which shows an image detected by an optical inspecting device.
Figure 2B:
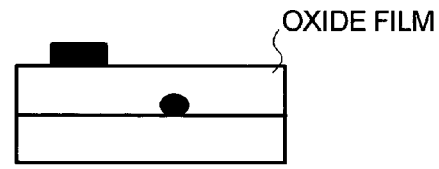
FIG. 2(b) is a cross-sectional view illustrating a section taken along line A—A of FIG. 2(a)

One example of an image used in a detection by the corresponding defect inspecting device is shown in FIG. 2(a), with the use of the inspecting device 3. The same figure illustrates an example in which, after a circuit pattern is formed, a layer of a silicon oxide film is formed as an insulating film, and a wiring pattern is formed over the layer, with the result that a foreign substance exists below the oxide film. Since the silicon oxide film is optically transparent, the wiring and foreign substance below the oxide film are contained in the image, as shown in FIG. 2(b), except for wiring lying on the top surface. In such a case, the defect inspecting device, for optically detecting a defect detects the foreign substance that exists in the image and identifies it as a defect.

Figure 3A:
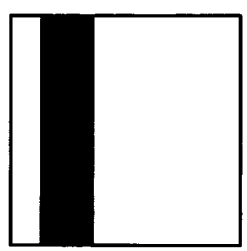
FIG. 3(a) is a diagram which shows a SEM image under normal conditions.

A review image observed by the reviewer 4 using an SEM is shown in FIG. 3(a). An accelerating voltage of a primary electron beam, at the time of observation of the semiconductor, normally makes use of a range of from several hundreds of eV to a few keV. The primary electron beam is applied to the surface of a specimen to scan the surface thereof, so that secondary electrons and reflected electrons generated from the neighborhood of the surface of the specimen are detected in sync with the scanning of the primary electron beam, whereby an image is formed. However, since the image is based on the secondary electrons generated from the surface of the specimen, the foreign substance and wiring that exist below the oxide film are not observed. Therefore, when no defect is observed under the normal observation conditions, it is not possible to judge whether disinformation is given from the defect inspecting device or whether a defect exists below the film.

Figure 3B:
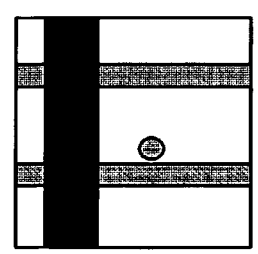
FIG. 3(b) is a diagram of a SEM image picked up and obtained on a high-speed condition.

On the other hand, when the accelerating voltage is set so as to range from a few tens of keV to a few hundreds of keV, the electron beam penetrates the surface of the specimen, so that the secondary electrons and reflected electrons generated from the inside of the surface thereof can be captured. Therefore, the internal structure thereof can be imaged. That is, the foreign substance and wiring located below the oxide film can be observed, as shown in FIG. 3(b), by using an observation condition based on the use of a high accelerating voltage.

Figure 4:
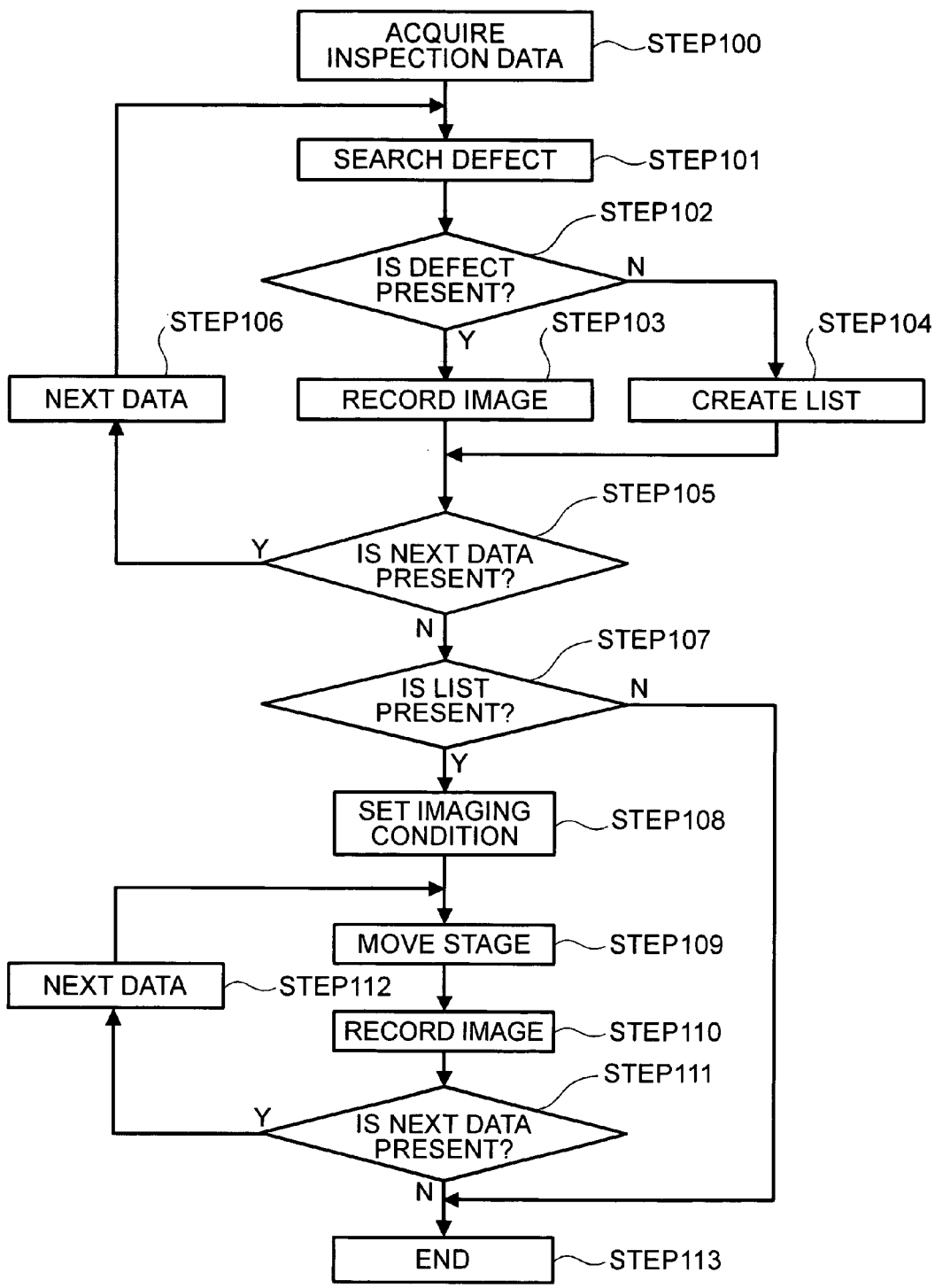
FIG. 4 is a flow diagram showing a procedure for acquiring a review image, according to the present invention.

However, since information concerning the interior of the specimen is observed as information superimposed on information concerning the surface thereof, such an observation condition based on the use of high accelerating voltage is not necessarily fit for the observation of a defect on the surface. Therefore, an embodiment illustrative of a sequence, in which the observation of a defect on the surface of the specimen and the observation of a defect located beneath the surface are compatible, is shown in FIG. 4.

That is, inspection data containing information concerning the position of a defect detected by the inspecting device 3 is first acquired at STEP100. The inspection data may be provided from the data management server 1 shown in FIG. 1 through the network 7, or it may be provided directly from the inspecting device 3 through the network 7. Alternatively, the provision of the inspection data may be c carried out using a portable information media, such as a floppy (registered trademark) disk, a magnetic optical disk or a memory or the like, which carry information provided by through the inspecting device 3.

Next, a defect search is carried out at STEP101. The defect search is performed by moving the stage to the defect position indicated by the inspection data obtained at STEP100 and using an image acquired at that position. When no patterns exist in the background after film deposition or the like, a defect can be searched for by detecting areas that are different in brightness within the image. The detection of the areas that are different in brightness can be performed by, for example, performing binarization using a value obtained by adding a given suitable value to an average luminance of an image and detecting an area or region having an area of a prescribed certain value or more. When patterns exist in the background, an image for an area having the same pattern as that of a nearby chip is captured together as a reference image and computed by comparison with the image acquired at the defect position. Thus, the corresponding defect can be searched for by searching a position where a difference therebetween is recognized. The search for a defect is not limited to a technique based on the above-described example, but may be any technique that allows a defect on the screen be searched for and in which the presence or absence of a defect can be judged.

Next, it is determined at STEP102 whether a defect exists. When a defect is found to exist, an image is recorded at STEP103. As to the recording of the image, the defect image used for the defect search at STEP101 may be recorded. Alternatively, the searched for defect position is imaged or picked up in a magnified form as a reference position, and the picked-up image may be recorded. Also, the reference image used for the defect search may be recorded together. When a defect is found to be absent, a list is created at STEP104 using such information that the defect can be uniquely specified in the inspection data, such as an ID number of the defect, etc.

Next, it is determined at STEP105 whether next data exists in the inspection data. When next data is found to be present, target data is set as the next data at STEP106, and STEP101 to STEP105 are repeatedly executed. When next data is found to be not present, it is judged at STEP107 whether the list created at STEP104 exists.

When no list exists, the sequence proceeds to STEP113, where the processing is terminated.

When the list is found to exist, the imaging condition is set at STEP108. For example, the accelerating voltage is set to a predetermined given accelerating voltage of a few tens of kV to a few hundreds of kV, corresponding to high accelerating voltages as typically used for the observation of a semiconductor. Next, at STEP109, the stage is moved to set an imaging visual field to the defect position recorded in the list. At STEP110, an image at the position is recorded. It is then determined at STEP111 whether next data exists in the list. When it is found that next data does not exist, the sequence proceeds to STEP113 where the processing is terminated. When next data is found to exist, target data is set as the next data recorded in the list at STEP112, and STEP109 to STEP111 are repeatedly executed.

With the execution of a review by such a sequence, an image can be recorded under normal review conditions suitable for observation of a defect in the case of a defect that exists on a film. When no defect exists on the film, an image can be recorded under the condition that a defect that exists below the film can be observed. That is, it can be determined, by observation of an image acquired under a condition in which a defect existing below the film can be observed, whether the defect corresponds to a defect existing below the film or disinformation produced by the inspecting device.

Figure 5:
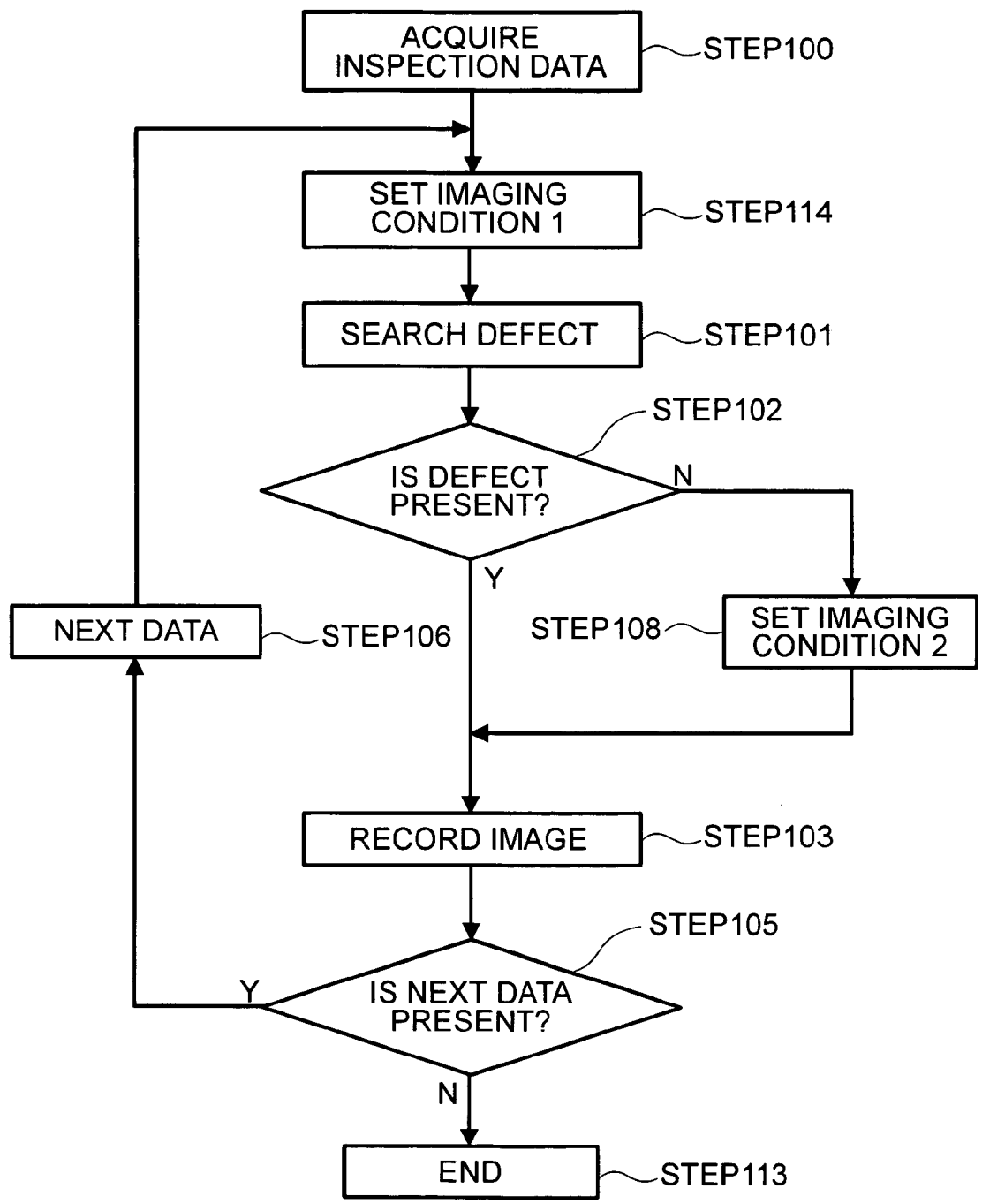
FIG. 5 is a flow diagram illustrating a procedure for acquiring a review image, according to the present invention.

The imaging condition may be changed, according to the result of a determination obtained at STEP102, so as to acquire an image. The sequence used in such a case is shown in FIG. 5. STEPS identical to the STEPs shown in FIG. 4 are marked with the same numbers to indicate the same processing contents.

An imaging condition at a prescribed certain accelerating voltage of a plurality of accelerating voltages ranging from a few hundreds of V to a few kV, which are suitable for observation of a surface defect, is set as an imaging condition 1. An imaging condition at a prescribed certain accelerating voltage is of the accelerating voltages ranging from a few tens of kV to a few hundreds of kV, which are suitable for observation of a below-film defect, is set as an imaging condition 2. After acquisition of inspection data at STEP100, the imaging condition of the SEM is set to the imaging condition 1 at STEP114. When the imaging condition thereof has already been set, nothing is done. Next, a defect search is performed at STEP101. It is determined at STEP102 whether a defect exists. When a defect is found to be present, an image is recorded at STEP103. When no defect exists, the imaging condition of the SEM is set to the imaging condition 2 at STEP108, and image recording is carried out at STEP103. It is then determined at STEP105 whether next data exists. When next data is found to exist, the next data is set as target data at STEP106, and STEP114 to STEP105 are repeated.

Now, upon image recording when a decision is made as to the absence of defect at STEP102, the image under the imaging condition 1 may be recorded together with the image under the imaging condition 2.

Rather than the decision of STEP102 as to whether a defect is present, whether defects that fall under a prescribed specific category exist may be determined according to a defect automatic classification, such as shown in the above-referenced patent document 2. At this time, the prescribed specific category is considered to include, for example, "disinformation", "underbed defect", etc. Although two-stage type examples have been described in the embodiments illustrated in FIGS. 4 and 5, a plurality of imaging conditions greater than two may be used for setting of the imaging condition.

Figure 6:
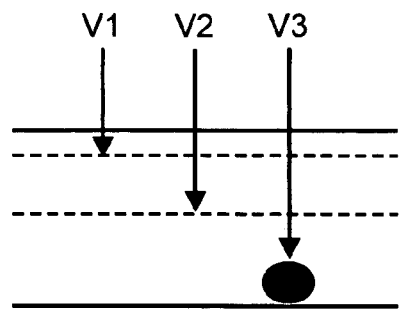
FIG. 6(a) is a diagrammatic sectional view of a specimen, showing depths visualizable by accelerating voltages.
FIG. 6(b) is a diagram of a SEM image acquired by an accelerating voltage V1.
FIG. 6(c) is a diagram of a SEM image acquired by an accelerating voltage V2.
FIG. 6(d) is a diagram of a SEM image acquired by an accelerating voltage V3.
Figure 6:
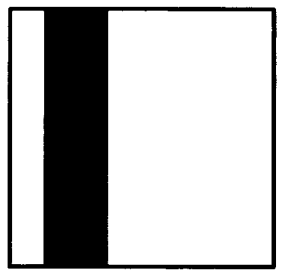
Figure 6:
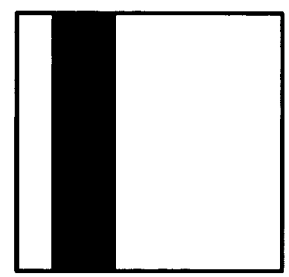
Figure 6:
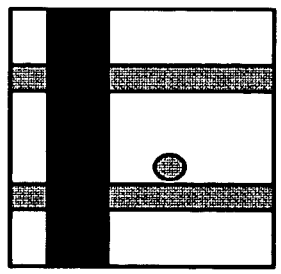
Figure 7:
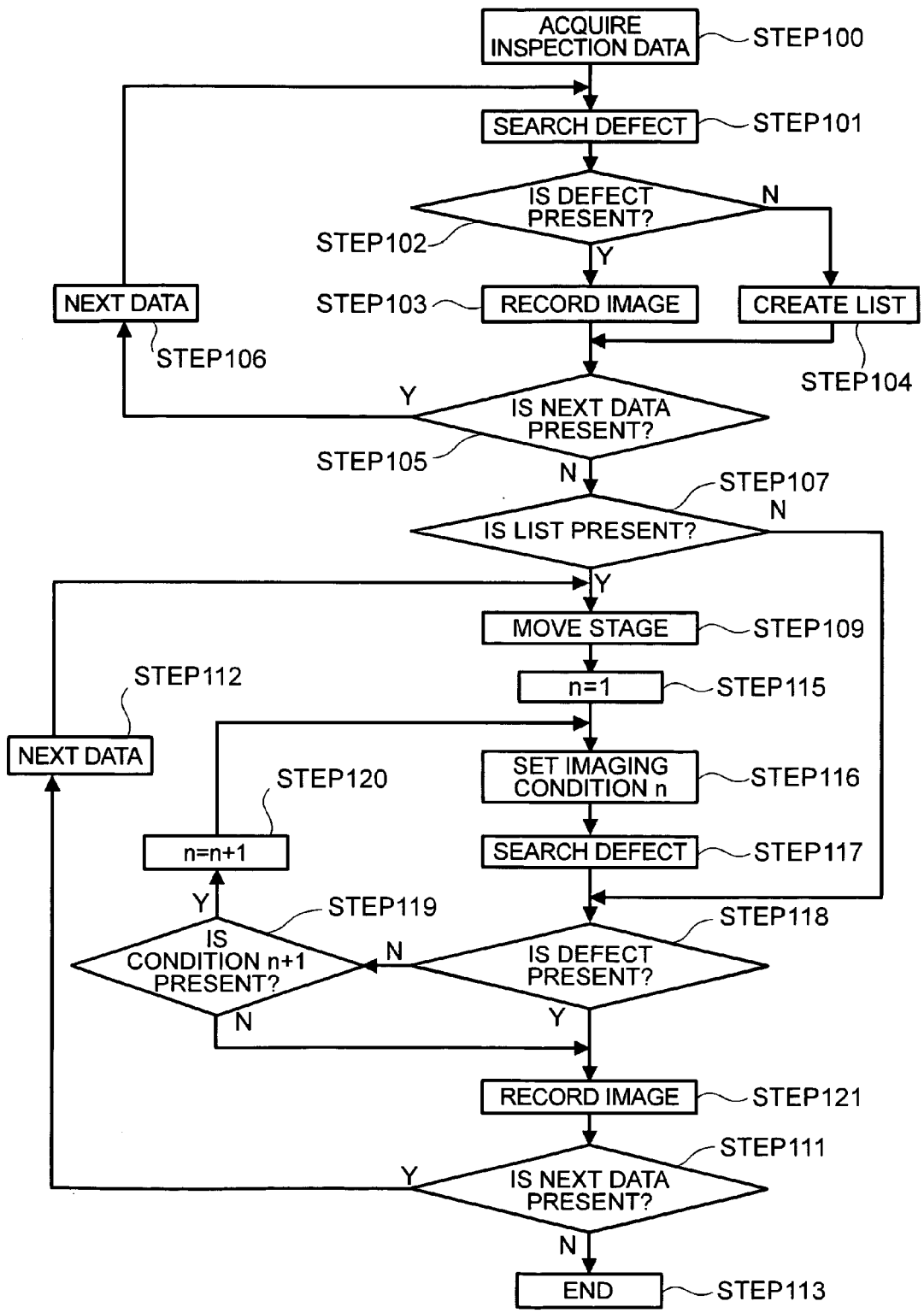
FIG. 7 is a flow diagram showing a procedure for acquiring a review image, according to the present invention.

Since the depths visualizable by accelerating voltages are different, as shown in FIG. 6(*a*), imaging is carried out under a plurality of observation conditions which have different accelerating voltages at which a particular type of defect can be observed, whereby depth information indicative of the presence of the defect may be obtained. No defect can be observed at accelerating voltages V1 and V2, as shown in FIGS. 6(*b*) and 6(*c*), for example. However, when a corresponding defect is observed at an accelerating voltage V3, as shown in FIG. 6(*d*), it can be seen that a defect exists at a depth corresponding to the accelerating voltage V3. An embodiment of an image acquisition sequence in such a case is shown in FIG. 7.

First of all, a plurality of imaging conditions, which are used where no defect is detected under the normal imaging conditions are set in advance. STEP100 to STEP107 are similar to the corresponding STEPs shown in FIG. 4. At STEP109, the stage is moved in such a manner that the position of a defect indicated in a list comes into view. Next, the imaging condition is regarded as a preset first condition at STEP115, and the imaging condition is set to the corresponding condition at STEP116. Then, a defect search is performed using an image picked up under the imaging condition at STEP117. It is determined in STEP118 whether the corresponding defect exists. When it is determined that no defect exists, it is judged at STEP119 whether the following different imaging condition is being set. When the imaging condition is found to have been set, the next imaging condition is set so as to be used at STEP120, and thereafter STEP116 to STEP118 are repeated. When no imaging condition is set, the picked-up image is recorded at STEP121. Even when it is determined at STEP118 that a defect exists, the image picked up at STEP121 is recorded. It is then determined at STEP111 whether a following data exists in the list. When a next data is found to be absent therein, the sequence proceeds to STEP113, where the processing is terminated. When the next data is found to exist therein, target data is regarded as the next data recorded in the list at STEP112, and STEP109 to STEP121 are repeatedly executed.

Now consider the following as a method of defining the plurality of imaging conditions. For instance, the range of an increase in accelerating voltage used in imaging and the maximum accelerating voltage condition are fixed, and an accelerating voltage obtained by adding the range of an increase in the accelerating voltage to the current accelerating voltage condition may be set as the following imaging condition in response to the condition change at STEP120. In this case, a decision may be made at STEP119 as to whether the imaging condition exceeds the maximum accelerating voltage condition set in advance.

Although the present embodiment has been described on the basis of an example in which imaging is effected on each individual defect at STEP107 or later, while the accelerating voltage is being changed, it might also be advisable to perform a defect search at a given accelerating voltage, create a list of defects imaged at other imaging conditions from the presence or absence of the defects and image only the defects registered in the list on the next imaging condition in a manner similar to STEP101 to STEP105.

Although the presence or absence of a defect has been set as a criterion in the present embodiment, the result of automatic classification may be set as the criteria.

Here, the defect search at STEP117 may be carried out by detecting the difference from a reference image, as in the sequence shown in FIG. 4. Alternatively, the defect search may be performed by detecting the difference from an image acquired at another imaging condition such that the coordinates of a defect fall within the visual field.

At this time, a decision made as to at which accelerating voltage is being used when the defect is detected, and this may be outputted as the attribute of the defect. Alternatively, the accelerating voltage, at which the defect has been detected, is associated with a prefixed mark and the mark may be outputted as an attribute of the defect. For instance, the attributes may be defined as in the case of a "below-film defect 1", when a defect is detected at accelerating voltages ranging from 10 kV to 50 kV, a "below-film defect 2", when a defect is detected at accelerating voltages ranging from 50 kV to 100 kV, and a "below-film defect 3", when a defect is detected at an accelerating voltage of 100 kV or more.

Alternatively, the relationship between accelerating voltages and visualized depths may be determined in advance. Then, the accelerating voltage, at which the corresponding defect is detected, is converted to depth information indicative of the presence of a defect, and the depth information may be outputted. The accelerating voltages and the visualizable depths can be determined experimentally by creating a sample, as shown in FIGS. 8(1) and 8(b), for example. FIG. 8(a) is a diagram showing a section of the sample. The sample is equivalent to one in which metal thin films, which already have a known thickness, are stacked on one another, while their areas are different. A portion other than the metal films is covered with a silicon oxide film. An example in which the sample is imaged at a certain accelerating voltage, is illustrated in FIG. 8(b). In the same figure, it is determined in advance whether it is possible to judge which layer would be different from the oxide film portion. Consequentially, the correspondence between an accelerating voltage used in imaging and its corresponding visualizable depth can be determined.

The analysis condition for the analyzer 5 shown in FIG. 1 may be set using the defect depth information obtained by the present technique. When an EDX is used as the analyzer, for example, the energy of characteristic X rays, which are emitted when an electron beam is applied to an object to be measured, is analyzed to perform an analysis on elements contained therein. At this time, the depth, at which the characteristic X rays are emitted, changes according to the accelerating voltage of the electron beam being applied. As the accelerating voltage becomes lower, the depth becomes more shallow, whereas as the accelerating voltage increases, information about a deep region can be captured. Therefore, an accelerating voltage condition suitable for execution of an EDX analysis on each defect is estimated from the depth information obtained by the present technique, and the analysis may be performed on the basis of the accelerating voltage condition. A suitable accelerating voltage may be estimated using simulation, or it may be determined experimentally using the sample shown in FIG. 8(a).

At the accelerating voltage obtained by the present technique, at which a defect below the film can be observed, for example, the stage is tilted or the orbit of the beam is tilted to acquire images from plural directions, as shown in FIGS. 9(a) and 9(b). A reconstruction at a three-dimensional position such as shown in FIG. 9(c) may be carried out from its parallax. A method of performing a three-dimensional reconstruction using the images obtained from plural directions is a well-known method which is used in the case of robot vision or the like. Owing to the reconstruction at such a three-dimensional position, the accuracy of a defect position in a defect depth direction can be improved. Displaying the defect in a perspective view on the basis of three-dimensional information enables a user to viscerally grasp a defect position and the structure of a defect. An embodiment of the present invention, which is used to implement such a technique, will be explained next.

Figures 10, 11:
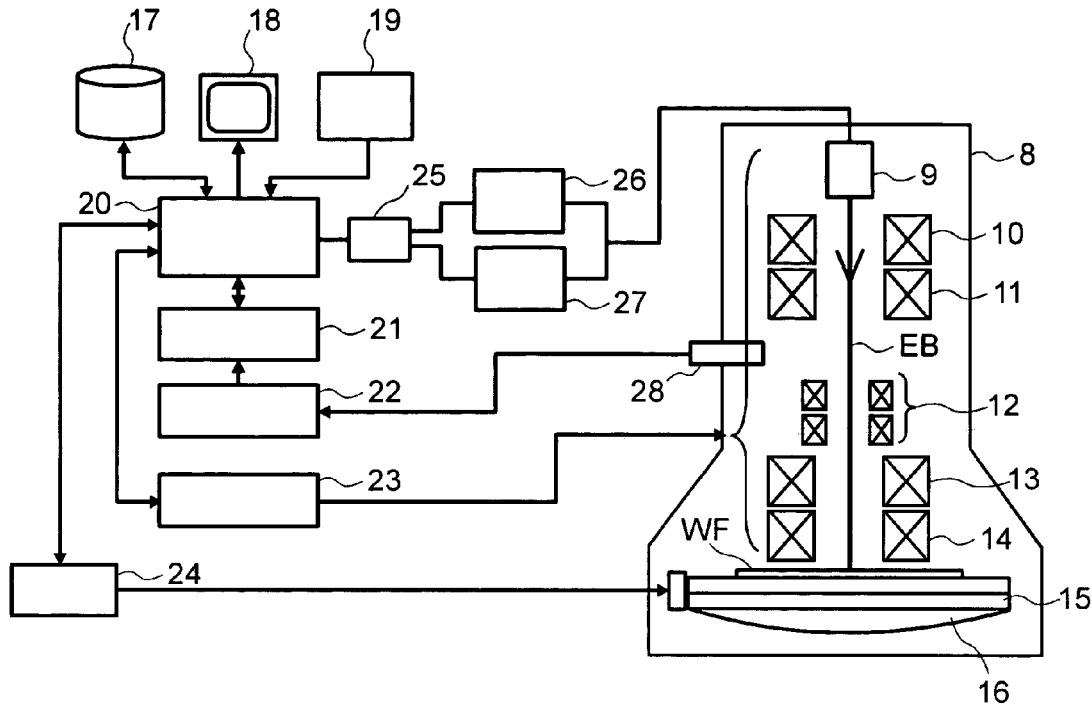
FIG. 10 is a block diagram showing one embodiment of an inspection device according to the present invention.
FIG. 11 is a diagram illustrating one example of an output screen according to the present invention.

FIG. 10 is a block diagram showing one embodiment of an elemental analysis device according to the present invention. In FIG. 10, WF indicates a semiconductor wafer, EB indicates an electron beam, and reference numeral 8 indicates an image pick-up device in the form of a scanning electron microscope. The scanning electron microscope includes an electron source 9, condenser lenses 10 and 11, a deflection scanning coil 12, objective lenses 13 and 14, an XYZ stage 15, and a stage tilt mechanism 16. In the system for controlling the scanning electron microscope, there are a storage device 17, a monitor 18, an input device 19, a general controller 20, an image arithmetic unit 21, an A/D converter 22, an electron optical-system controller 23, a stage controller 24, a power switcher 25, high-voltage stabilized power supplies 26 and 27, and a signal detector 28.

In FIG. 10, the electron source 9, electron optical system 10 through 14, detector 28, XYZ stage 15 and stage tilt mechanism 16 constitute a SEM. This is used as the imaging device 8 for the semiconductor wafer WF mounted onto the XYZ stage 15.

The semiconductor wafer WF to be reviewed is mounted onto the XYZ stage 15. The XYZ stage 15 is controlled movably in X, Y and Z directions and a tilt direction by the stage controller 24 on the basis of a control signal outputted from the general controller 20. The imaging device 8, using the SEM, images the semiconductor wafer WF fixed to the XYZ stage 15 in an enlarged form. That is, the electron beam EB emitted from the electron source 9 is converged by the condenser lenses 10 and 11 and the objective lenses 13 and 14 and scanned by the deflection scanning coil 12, so that the electron beam EB is applied to the semiconductor wafer WF. With the application of the electron beam EB, secondary electrons and reflected electrons obtained from the semiconductor wafer WF are detected by the detector 28 to produce a signal, which is processed by the A/D converter 22, whereby an SEM image of the semiconductor wafer WF is generated.

Image processing, such as a defect detecting process, is performed at the image arithmetic unit 21. A user inputs terms, such as a defect observation condition, etc., through the input device 19.

An accelerating voltage condition given in a range of from a few hundreds of V to a few kV (hereinafter called a "normal accelerating voltage") suitable for observation of a surface defect, and an accelerating voltage condition given in a range of from a few tens of kV to a few hundreds of kV (hereinafter called a "high accelerating voltage") suitable for observation of a below-film defect involve a significantly different accelerating voltage. Therefore, only the objective lens 13 is used in the case of the normal accelerating voltage, whereas, in the case of the high accelerating voltage, the objective lenses 13 and 14 are both used to enhance the intensities thereof. Alternatively, the XYZ stage 15 is controlled to increase the working distance corresponding to the distance between each of the objective lenses and the WF, whereby control is carried out such that the required focuses are achieved is performed. Alternatively, a power supply for the normal accelerating voltage and a power supply for the high accelerating voltage are respectively included in a power supply for the electron source. They are switched by the power switcher 25 according to the accelerating voltage to be used for observation. These three operations may all be carried out upon accelerating voltage switching. Alternatively, one may be used or two or more may be used in combination.

Although the present embodiment is directed to an example in which two objective lenses are used, the present invention is not limited to the use of two such lenses, but a plurality of objective lenses greater than two may be used as well. Suitable lenses may be used in plural form according to the set accelerating voltages.

An example of an output screen according to the present invention is shown in FIG. 11. A lot number of a wafer, a wafer number and the name of a process are displayed on the screen as wafer information intended for review. The displayed information is not limited to this example, but may take the form of information capable of uniquely specifying the wafer and the inspecting process. An ID number for specifying a reviewed defect is also displayed. An image acquired at the normal accelerating voltage and an image acquired at the high accelerating voltage are displayed side by side within the same screen. Imaging conditions for the images and their classified categories may be displayed together. It is not always necessary to display the information simultaneously with the images. They may be displayed by performing some operation, such as pressing a button.

Figure 12:
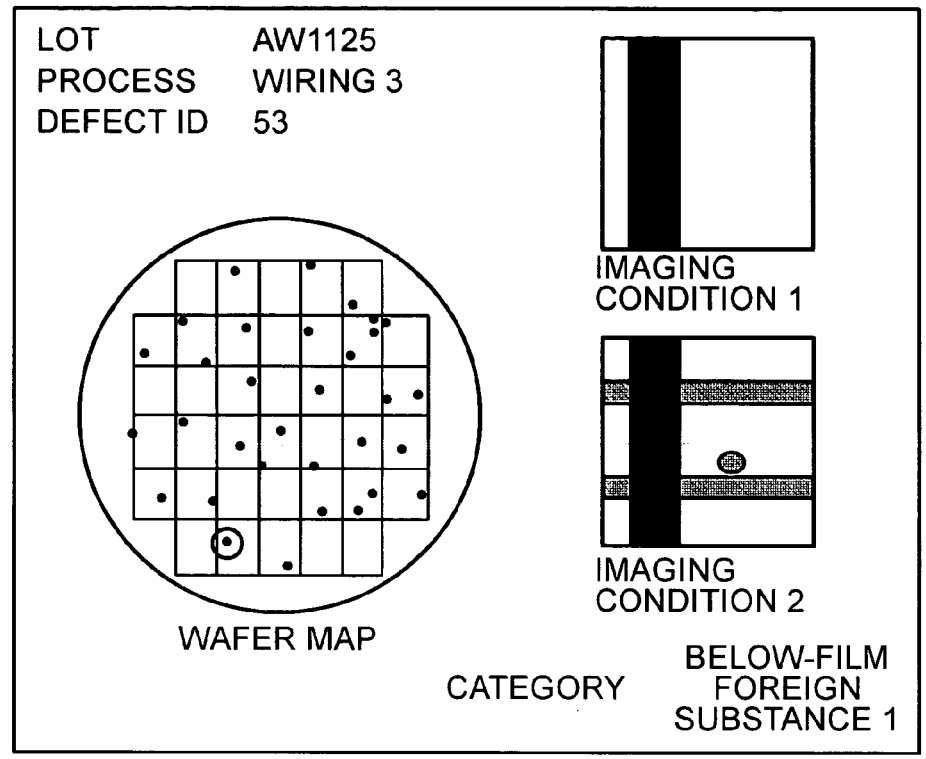
FIG. 12 is a diagram depicting one example of an output screen according to the present invention.

As shown in FIG. 12, a wafer map, in which position information on defects detected in the inspecting process are plotted on a wafer, may be displayed together with the images shown in FIG. 11. At this time, the position of the corresponding defect, where an image is being displayed, may be highlighted.

Figure 13:
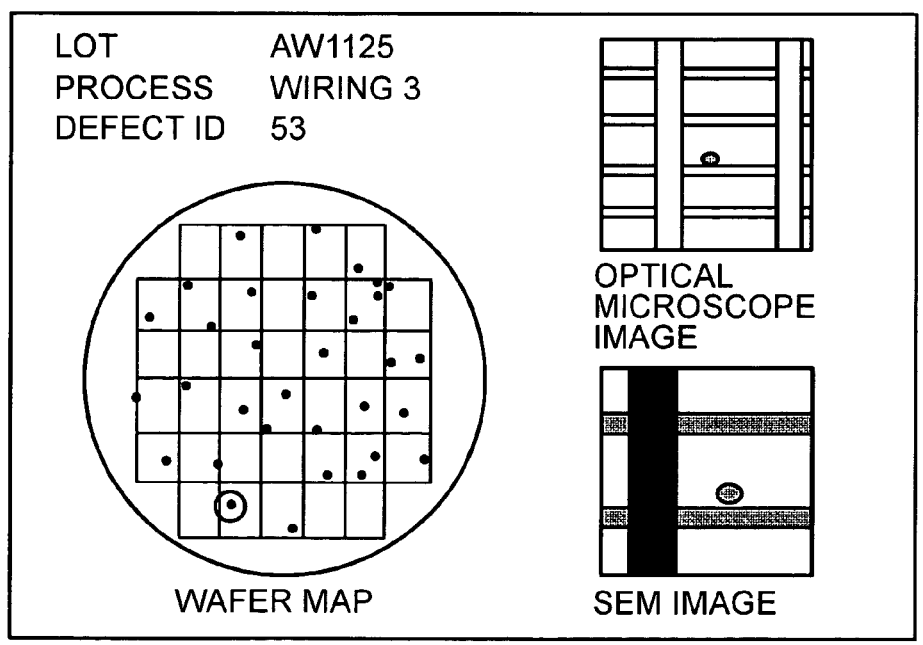
FIG. 13 is a diagram showing one example of an output screen according to the present invention.

As shown in FIG. 13, an image detected by the defect inspecting device, a review image obtained by an optical system equivalent to one for defect inspection, and an image acquired by the SEM may be displayed side by side within the same screen.

Figure 14:
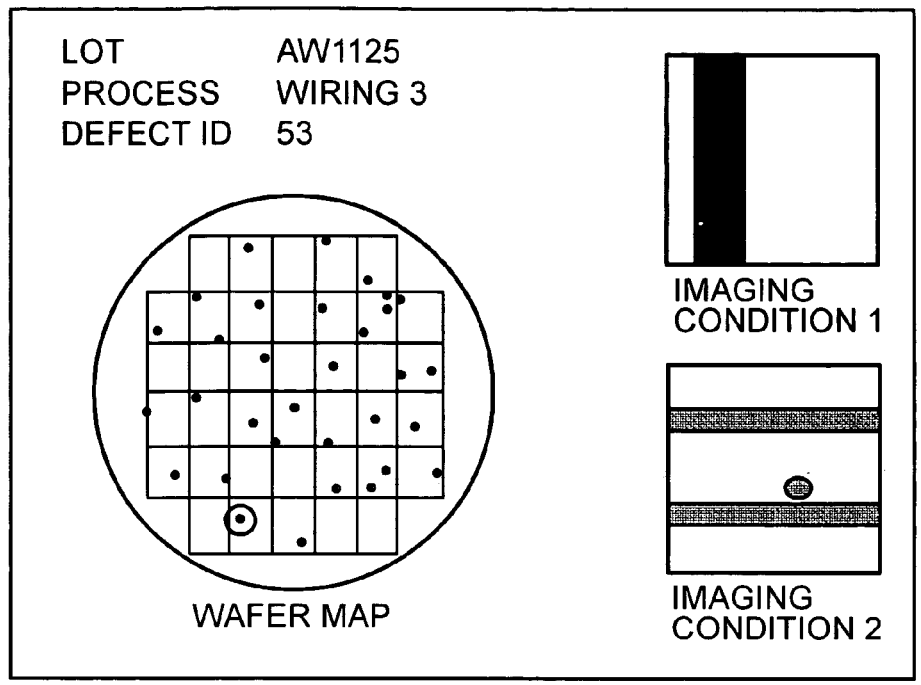
FIG. 14 is a diagram illustrating one example of an output screen according to the present invention.

As shown in FIG. 14, an image acquired at a normal accelerating voltage and an image acquired at a high accelerating voltage are difference-computed to take out patterns that exist in the surface from the image acquired at the high accelerating voltage. Thus, images corresponding to only internal patterns and a defect are created and may be displayed. While both images are being separately displayed in the present example, the respective images may be displayed in a superimposed form so as to be distinguishable from each other. As a method of discriminably displaying the images, for example, images, in which only the internal patterns and the defect are extracted, may be displayed with the application of colors thereto on a pseudo basis.

Figure 15:
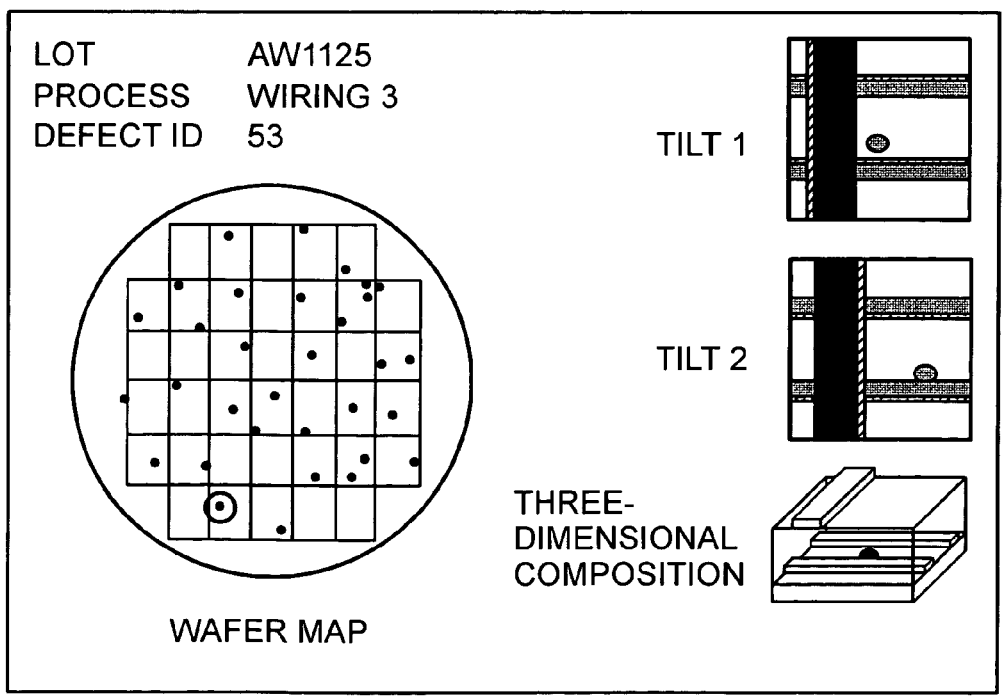
FIG. 15 is a diagram showing one example of an output screen according to the present invention.

As shown in FIG. 15, images acquired with the wafer being tilted at different the angles and a bird's-eye image subsequent to its three-dimensional, i.e., stereoscopic construction, may be displayed in combination.

Upon display of an image, the image may be subjected to image processing and displayed to improve the resolution of a below-film defect. At this time, parameter of a filter used for image processing may be changed depending on the accelerating voltage used for image acquisition. When the outline is indefinite, as in the case of, for example, a pattern and a defect located in positions deep from the surface, the size of an intensification filter may be made larger as the accelerating voltage increases.

An example of an input screen for an imaging condition, according to the present invention, is shown in FIG. 16. As imaging conditions, an imaging condition at a normal accelerating voltage and an imaging condition at a high accelerating voltage can be respectively inputted. An input condition may include the number of the condition, an accelerating voltage, a probe current, a visual field size, the number of times that images are added, etc. Those items other than the number of the condition, the accelerating voltage and the visual field size may automatically be set with rules being fixed in advance. They may be selected from preset numerical values through a pull-down menu or the like. An imaging magnification may be inputted in place of the visual field size.

When the sequence described in conjunction with FIG. 7 is used, an initial value of an accelerating voltage, an increased width of the accelerating voltage and the maximum value of the accelerating voltage may be inputted, as shown in FIG. 17. They may be selected from preset numerical values through a pull-down menu or the like.

Review under a normal accelerating voltage condition and review under a high accelerating voltage condition may be performed by different devices. That is, to begin with, a review is performed by a first review SEM based on the condition suitable for a normal surface observation on the basis of coordinate information obtained by the defect inspecting device. The selection of defects on which the review is effected, based on the high accelerating voltage condition, is performed based on the result of review. For example, a defect unobserved at a coordinate position, such a defect being convex in a surface view, but ambiguous in outline, and where the nucleus of a foreign substance is considered to exist below a film, etc., are selected. Next, the defect is observed by a second review SEM based on the condition suitable for below-film observation using a high accelerating voltage. At this time, the imaging condition may be changed according to the manner of observation of the defect so as to acquire an image as described in conjunction with STEP116 to STEP121 of FIG. 7. The attributes of the defects are judged in accordance with a combination of review results by the respective devices. The attributes can be determined as in the case of, for example, "disinformation or deep below film" when no defects are found by both the first review SEM and the second review SEM, "shallow below film" when no defect is found by the first review SEM and a defect is found by the second review SEM, and "shallow and convex below film" when the defect is convex at the first review SEM and the defect is found at the second review SEM.

Owing to the provision of a user with this attribute information, the user is able to have clues that allow the user to estimate at which steps of the process a defect would occur and what could have caused it.

Attribute information about each detected defect is outputted from the defect inspecting device, and the condition under which observation is performed by a review SEM may be changed based on the attribute information. Now consider where, in a given process in which a silicon oxide film is formed on the surface, for example, a foreign substance existing on the top surface is observed as black, and a foreign substance existing in the film is observed as green. At this time, the defect inspecting device outputs the attributes of "defect above film" as a black defect and "defect in film" as a green defect in conjunction with the number inherent in each defect and the defect position information. The review SEM may first perform image acquisition at a normal accelerating voltage with respect to the defect having the attribute of "defect above film" in response to the above information, and next perform image acquisition at a high accelerating voltage with respect to the defect having the attribute of "defect below film".

Although the present invention has been described on the basis of an example in which, in the method of adding an attribute using the defect inspecting device, the attribute is added based on a difference in appearance, the attribute determining method is not limited to a difference in appearance. The attribute may be determined based on, for example, a difference in circumstance observed by a dark field optical system or information given by another optical system. It may be feasible to acquire information about the existing positions of defects above and below a film.

The invention may be embodied in other specific forms without departing from the spirit or essential characteristics thereof. The present embodiment is therefore to be considered in all aspects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method for collecting defect images of a specimen, comprising the steps of:
    setting an electron optical system of an electron microscope to a first imaging condition which includes setting of an acceleration voltage of a primary electron beam for irradiating the specimen in a range of a few hundred eV to a few KeV;
    setting a visual field of the electron microscope in such a manner that the position of a defect to be reviewed falls within the visual field of the electron microscope set to the first imaging condition, using data about the position of the defect to be reviewed, which is obtained beforehand by inspecting the specimen using an inspecting device;
    imaging the position of the defect to be reviewed set within the visual field, using the electron microscope set for the first imaging condition to acquire a first image of the visual field including the defect position;
    processing the acquired first image to determine whether or not the defect is present;
    when the defect is present in the first image, storing an image of the defect in a memory;
    when the defect is not present in the first image, setting the electron optical system to a second imaging condition which includes setting of the acceleration voltage of the primary electron beam for irradiating the specimen in a range of a few tens KeV to a few hundreds KeV; and
    when the defect is not present in the first image, imaging the visual field by the electron microscope under the set second imaging condition to acquire a second image of the visual field including information under the surface of the specimen.

2. The method according to claim 1, wherein the height of the specimen is adjusted according to the first imaging condition and second imaging condition of the electron microscope.

3. A method for collecting defect images of a specimen, comprising the steps of:
    scanning a converged electron beam of an electron microscope in an area on a specimen, where a defect to be reviewed is included, under a first imaging condition using information about the position of the defect to be reviewed, which is obtained beforehand by using an inspecting device, and detecting a secondary charged particle generated from the specimen, thereby acquiring an image of the area on the specimen
    processing the acquired image to detect the defect to be reviewed;
    when the defect to be reviewed is detected in the acquired image, storing an image of the defect to be reviewed in a memory;
    when the defect to be reviewed is not detected in the acquired image, setting the electron microscope to a second imaging condition which includes an increase of an accelerating voltage of a primary electron beam of the electron microscope with respect to an accelerating voltage of a primary electron beam of the electron microscope utilized in the first imaging condition; and
    scanning the converged electron beam of the electron microscope in the area of the specimen under the second imaging condition and detecting a secondary charged particle generated from the specimen, thereby acquiring an image of the area of the specimen, including information under a surface of the specimen.

4. The method according to claim 3, wherein the accelerating voltage of the primary electron beam of the electron microscope under the first imaging condition ranges from a few hundreds eV to a few KeV, and the accelerating voltage of the primary electron beam of the electron microscope under the second imaging condition ranges from a few tens keV to a few hundreds KeV.

5. The method according to claim 3, wherein the height of the specimen is adjusted depending on the first imaging condition and the second imaging condition of the electron microscope.

6. The method according to claim 3, wherein an image obtained by imaging under the first imaging condition of the electron microscope, and an image obtained by imaging under the second imaging condition are displayed on the same screen.

7. An apparatus for collecting defect images of a specimen, comprising:
    memory means which stores position data of a defect to be inspected the data being obtained beforehand by inspecting the specimen by use of an inspecting device;
    imaging condition setting means which controls an electron optical system of an electron microscope and thereby sets imaging conditions;
    specimen position control means which controls the position of the specimen in such a manner that the position of the defect to be inspected falls within a visual field of the electron microscope, using the position data of the defect to be inspected the data being stored in the memory means;
    image processing means which processes images of the specimen for detecting the defect to be reviewed, the images being obtained by imaging under the imaging conditions set by the imaging condition setting means; and
    non-detected defect information storing mean which stores information of defect to be reviewed which is not detected by said image processing means;
    wherein the imaging condition setting means has a configuration capable of performing switching to either one of a first imaging condition under which an accelerating voltage of a primary electron beam applied to the specimen ranges from a few hundreds eV to a few KeV and a second imaging condition under which the accelerating voltage ranges from a few tens KeV to a few hundreds KeV, by the electron optical system of the electron microscope, and the imaging condition setting means switches to the second imaging condition from the first imaging condition using information of defect to be reviewed which is not detected by the image processing means set for said first imaging condition and stored in the non-detected defect information storing means.

8. The apparatus according to claim 7, further comprising specimen height adjusting means which adjusts the height of the specimen according to each accelerating voltage of the primary electron beam of the electron microscope, which is set by the imaging condition setting means.

9. The apparatus according to claim 7, further comprising display means, wherein the image obtained by imaging under the first imaging condition of the electron microscope, and the image obtained by imaging under the second imaging condition are displayed on the same screen of the display means.

* * * * *